(12) United States Patent
Keiflin et al.

(10) Patent No.: US 10,477,246 B2
(45) Date of Patent: Nov. 12, 2019

(54) METHOD FOR ENCODING STREAMS OF VIDEO DATA BASED ON GROUPS OF PICTURES (GOP)

(71) Applicant: VOGO, Montpellier (FR)

(72) Inventors: Pierre Keiflin, Carnon (FR); Christophe Carniel, Castelnau le Lez (FR); Daniel Dedisse, Prades le Lez (FR)

(73) Assignee: VOGO, Montpellier (FR)

( * ) Notice: Subject to any disclaimer, the term of this patent is extended or adjusted under 35 U.S.C. 154(b) by 44 days.

(21) Appl. No.: 15/764,683

(22) PCT Filed: Sep. 30, 2016

(86) PCT No.: PCT/FR2016/052508
§ 371 (c)(1),
(2) Date: Mar. 29, 2018

(87) PCT Pub. No.: WO2017/055771
PCT Pub. Date: Apr. 6, 2017

(65) Prior Publication Data
US 2018/0270507 A1    Sep. 20, 2018

(30) Foreign Application Priority Data
Sep. 30, 2015   (FR) ...................... 15 59299

(51) Int. Cl.
*H04N 11/02* (2006.01)
*H04N 19/65* (2014.01)
(Continued)

(52) U.S. Cl.
CPC .......... *H04N 19/65* (2014.11); *H04N 19/172* (2014.11); *H04N 19/177* (2014.11); *H04N 19/50* (2014.11)

(58) Field of Classification Search
CPC ...................................................... H04N 19/65
(Continued)

(56) References Cited

U.S. PATENT DOCUMENTS 5,768,533 A * 6/1998 Ran ........................ H04N 7/141
709/247
7,733,911 B2 * 6/2010 Lee ........................ H04L 1/1809
370/473

(Continued)

FOREIGN PATENT DOCUMENTS

| EP | 1329108 A2 | 7/2003 |
| EP | 1797661 A1 | 6/2007 |
| EP | 2892226 A1 | 7/2015 |

OTHER PUBLICATIONS

Watson, "Basic Forward Error Correction (FEC) Schemes," Network Working Group, Category: Standards Track, Mar. 2009, pp. 1-19.
(Continued)

*Primary Examiner* — Leron Beck
(74) *Attorney, Agent, or Firm* — Arent Fox LLP

(57) ABSTRACT

A method for encoding streams of video data based on groups of pictures (GOP) used in video coding to define the arrangement order of the images with internal coding and with predictive coding for generating a visible image, including redundancy transmission error correction means for transmissions over a wireless network controlled by a local data communication protocol. The video stream consists of consecutive data packets G, each packet G comprising a first set M containing the video data to be transmitted, and a second set comprising redundancy data obtained by a redundancy algorithm. According to the method, the first data set M is composed of all the data of at least one group of pictures (GOP).

17 Claims, 6 Drawing Sheets

(51) Int. Cl.
*H04N 19/177* (2014.01)
*H04N 19/172* (2014.01)
*H04N 19/50* (2014.01)

(58) Field of Classification Search
USPC .......................................... 375/240.01–240.29
See application file for complete search history.

(56) References Cited

U.S. PATENT DOCUMENTS

| | | | | |
|---|---|---|---|---|
| 7,788,568 | B1* | 8/2010 | Huang | H03M 13/01 |
| | | | | 709/224 |
| 9,094,641 | B1* | 7/2015 | Ansley | H04N 21/23424 |
| 2002/0199148 | A1* | 12/2002 | Krishnamachari | H04L 1/0083 |
| | | | | 714/752 |
| 2009/0135918 | A1* | 5/2009 | Mak-Fan | H04N 21/41407 |
| | | | | 375/240.28 |
| 2010/0100640 | A1* | 4/2010 | Nakao | H04N 5/765 |
| | | | | 709/246 |
| 2010/0189183 | A1* | 7/2010 | Gu | H04N 21/23439 |
| | | | | 375/240.28 |
| 2011/0194605 | A1 | 8/2011 | Amon et al. | |
| 2014/0314157 | A1 | 10/2014 | Hwang et al. | |
| 2015/0281746 | A1* | 10/2015 | Lam | H04N 21/2368 |
| | | | | 725/116 |
| 2016/0127709 | A1* | 5/2016 | Lewis | H04N 19/172 |
| | | | | 386/328 |

OTHER PUBLICATIONS

International Search Report issued in International Patent Application No. PCT/FR2016/052508, dated Feb. 22, 2017 (7 pages).

Liu et al., "Joint Source/Channel Coding for WWAN Multiview Video Multicast with Cooperative Peer-to-Peer Repair," Proceedings of the 2010 IEEE 18th International Packet Video Workshop, 2010, pp. 110-117.

Yuan et al., "A GoP Based FEC Technique for Packet Based Video Streaming," Proccedings of the 10th WSEAS International Conference on Communication, Jul. 2006, pp. 187-192.

* cited by examiner

METHOD FOR ENCODING STREAMS OF VIDEO DATA BASED ON GROUPS OF PICTURES (GOP)

CROSS REFERENCE TO RELATED APPLICATIONS

This application is a 35 U.S.C. 371 National Phase of PCT Application No. PCT/FR2016/052508 filed Sep. 30, 2016, which claims benefit to FR Application No. 1559299 filed Sep. 30, 2015, the disclosure of which is hereby incorporated by reference in its entirety.

The present invention deals with a method for encoding video data streams with a view to enhancing the reliability and the quality of reception of these streams in a wireless digital network, governed by a communication protocol for example of WIFI type. The streams concerned are sent in multicast mode and originate from at least one transmitter broadcasting them to receiving devices, in this case situated within a relatively restricted perimeter, such that they can operate with a communication protocol as mentioned, designed to operate in a more local environment. The receiving devices are then provided with at least one software application making it possible to process and view the information received.

More particularly, the video data effected by the invention are based on groups of pictures (GOP) conventionally used in video coding (in particular in the MPEG standards for the compression, the decompression, the processing and video and audio coding) to define the order of arrangement of the images with internal coding and with predictive coding allowing the generation of a visible image in a video stream. The streams processed in the context of the invention also comprise equally conventional transmission error correction means, the correction being done in this case by redundancy and being performed via algorithms known as AL-FEC (application level forward error correction) algorithms implementing a matrix function.

Although the method of the invention can have many practical applications, since it very generally optimizes the transmission of streams of pictures in real and/or quasi-real time, one of the applications envisaged is the virtually instantaneous broadcasting of events of sports meeting or show type, within the perimeter of an enclosed space where said event takes place. The quality of the video streams transmitted to the client devices primarily allow the fluid and good quality viewing of the video pictures, but also make it possible to enrich the viewing through processes capable of conferring an added value on the streams received, for example a repetition and therefore a reviewing of certain sequences, if necessary in slow motion or even with a zoom effect. Such processes would be almost meaningless if the quality of the video streams was not assured.

The video streams are usually transmitted in the form of successive information packets which obey a predetermined subdivision for the sending thereof, these packets very generally comprising the pictures to be transmitted, encoded for the transmission, and additional information which, in case of reception problems, is used for reconstruction algorithms to try to restore the initial pictures.

As such, the method of the invention applies to video streams composed in practice of successive data packets G, each packet G comprising, as is known, a first set M containing native video data to be transmitted (the pictures of the video stream encoded) and a second set containing redundancy data obtained by a suitable algorithm. According to the invention, the first set of data is composed from all the data M of at least one group of pictures (GOP).

The subdivision of the information packets to be transmitted in video streams therefore relies, innovatively according to the invention, on particular groups of pictures developed and defined in the context of standards organizing the architecture of the video data packets to be transmitted. The computer system charged with sending the video streams, and consequently the software driving same, consequently perform a subdividing of the information which is based on these groups of pictures, or GOP, formatted in a way that is standard in the video coding world, identifying a specific architecture based on particular coded pictures. The data M may come under a single group of pictures GOP, of which they then contain all the data, or two or more groups of pictures GOP, with this same condition of including all their data in one and the same packet.

Still according to the invention, the size of all the pictures of the group of pictures is added to the data M of the native video stream, in an area juxtaposing each picture, which, for example occupies two data bytes per picture.

Furthermore, according to one possibility, an index table containing the absolute position of each picture of the group of the pictures can be added to the data M, said table being able to be located in an area for example situated at the start of the series of coded pictures to be transmitted.

In practice, according to the invention, each packet G is then organized as K first data blocks of predetermined size L and N redundancy blocks of size L, K being equal to M/L, the next integer value immediately higher than the result of the division M/L being assigned to K if M/L is not an integer number. The portion of block corresponding to the difference $(K \times L - M)$, which exists only if M/L is not an integer number, is then filled by data identified as being stuffing data, for example zeros.

Preferably, according to the invention, for each of the blocks K and N, the information is added, comprising:
 the number of the group of pictures (GOP), incremented for each new group of pictures;
 the value of K, incremented from 1 to K for each block K;
 the value of N, beginning at K+1 and ending at N+K;
 the value of L; and
 the number of the block (from 1 to K+N).

The length of each of the blocks K and N then becomes L+n bytes that the coding of the above information requires. The existence of all these additional data, combined with the subdivision into blocks K+N of the native video information, itself based on a standard of video coding (one or more GOP), makes it possible to considerably enhance the control of the transmission of the video streams. The reconstruction operations to be implemented given the assumption of a corrupted transmission of the video streams are clearly facilitated by the novel architecture proposed.

Moreover, the invention relates also to a video stream organized according to the method applied above and comprising a succession of coded data packets G each composed of a first set of native video data to be transmitted and of a second set of error correction redundant data, characterized in that the first set contains all the data of at least one group of pictures (GOP).

This type of video stream, structured according to the method of the invention, makes it possible to guarantee a reception in a quality that is sufficient first of all for the viewing of the streams transmitted to be simply comfortable, then also for any subsequent processes applied to the signals transmitted to be able to be based on an information platform sufficient for the performance thereof.

The invention in reality culminates in organizing the information, that is to say the native video streams to be sent, so as to allow an optimization of the response of the system to defects in transmission of the video signal, based on a sufficiently structured and information-rich architecture.

It will now be described in more detail, with reference to the attached figures, representing an exemplary implementation of the method of the invention showing different possible steps for the generation of optimized video streams, for which:

Figure 1:
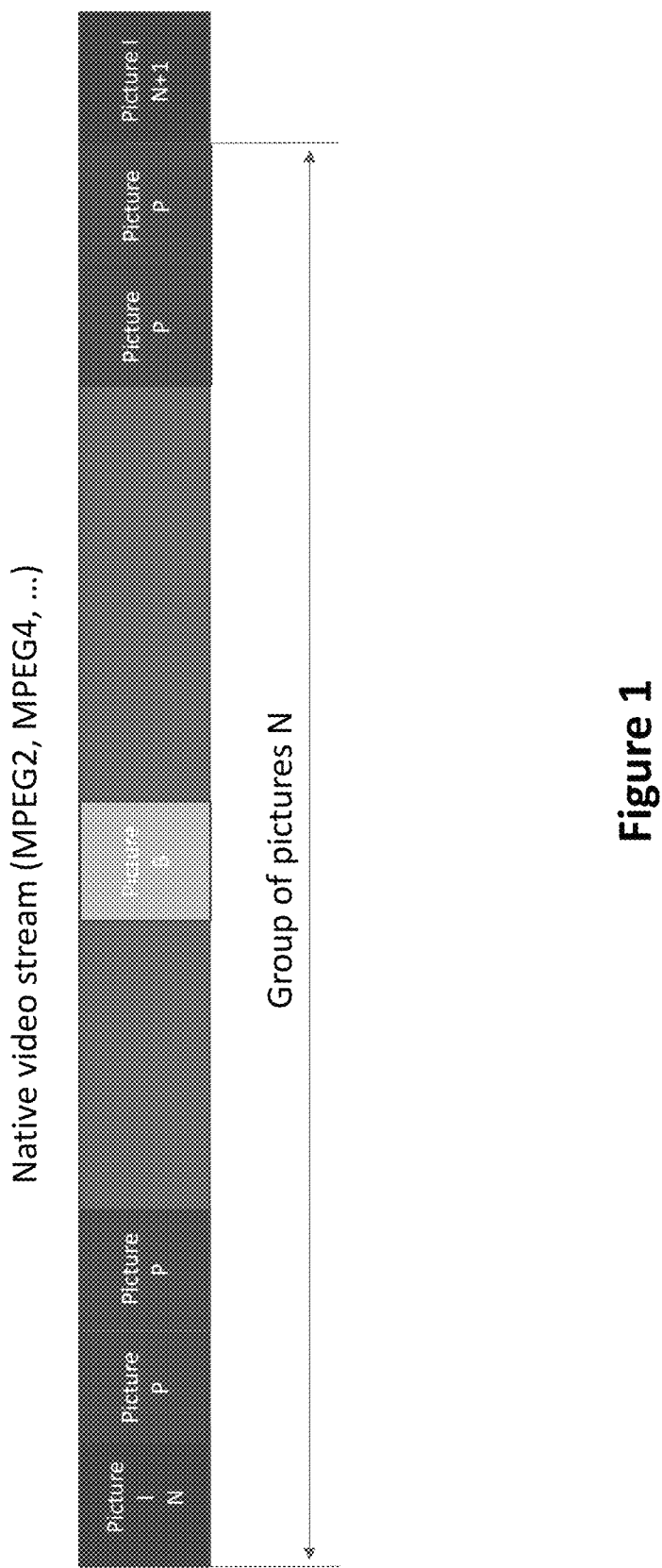
FIG. 1 represents a diagram schematically representing the organization of a group of pictures as used in the context of the invention.

Referring to FIG. 1, the first set of data, forming the native video stream to be transmitted before encoding of the transmission error correction function, is composed from all the data of a group of pictures. This data organization structure is well known in the field of video coding, since it is in particular defined by the MPEG standards. These groups of pictures, or GOP, define the nature and the order in which the pictures resulting from several particular types of codings are arranged. The grouping of these pictures in fact forms a particular series, this series being repeated periodically to constitute the encoding of a video stream. There are thus pictures with internal coding I and pictures with predictive coding, the latter being able to be of two types: the pictures P with predictive coding based on a past image, and the pictures B with bidirectional predictive coding. The pictures P contain information on difference, by motion prediction, with a picture I or a past image P. The pictures B contain information on difference with the past and future pictures I or P within a group of pictures.

For information, the pictures I or P can be used as reference pictures, although this is not generally the case with the pictures B. The visible pictures are, in short, generated from coded pictures contained in a group of pictures, which is also expressed as a number of coded pictures, which are constructed at the time of encoding so as to guarantee the video stream transfer rate.

As appears in particular in FIG. 1, the group of pictures N (GOP N) begins with a reference picture $I_N$, followed by pictures P and B in a particular order which defines said group of pictures. The video stream to be transmitted comprises this group of pictures N, followed by a group of pictures N+1 of which the initial picture $I_{N+1}$ is the new reference picture, preceded by a group of pictures N−1 and so on. The set of these groups of pictures $GOP_N$ forms the encoded video stream. For the present invention, the basis of the subdivision of the video data packets to be sent consists of these groups of pictures. FIG. 1 represents only one thereof, but there can be two or more thereof in the video data packets M.

Figure 2:
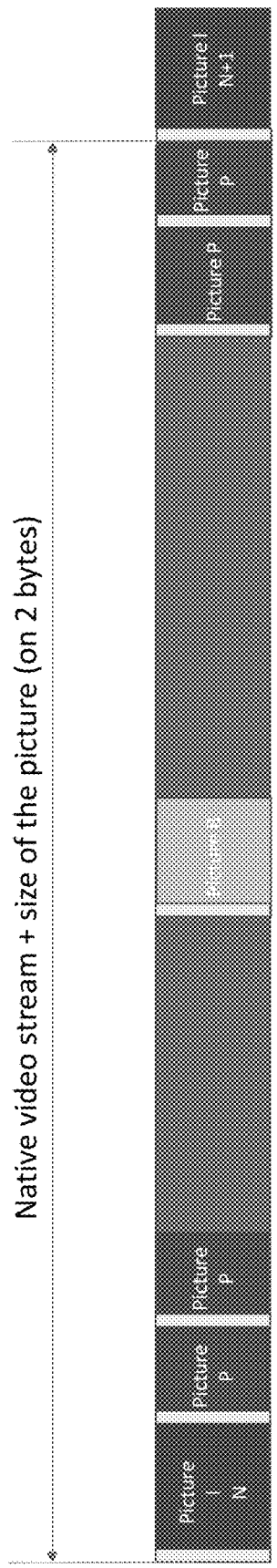
FIG. 2 illustrates, for a same data packet, the addition to the native video stream of the size of each coded picture of the group of pictures.
Figure 3:
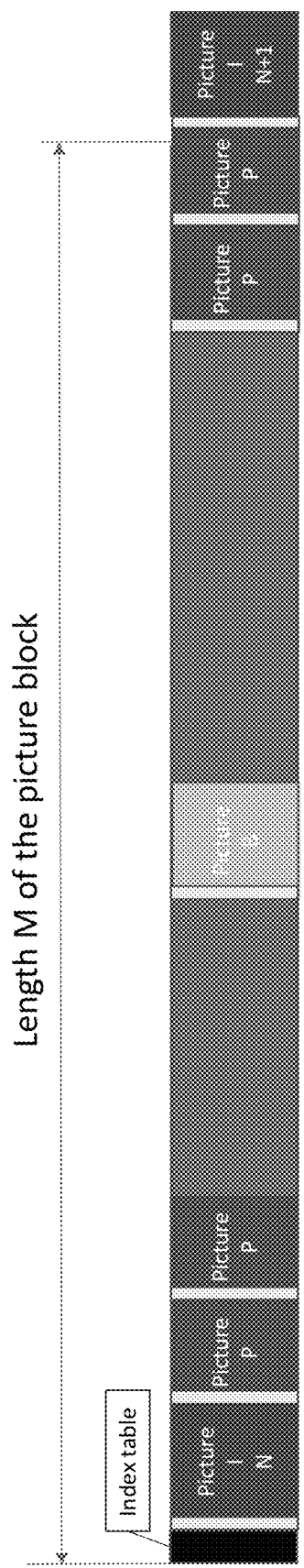
FIG. 3 shows the size M of the picture packet when an index table is added to the data.

FIG. 2 illustrates another feature of the method of the invention, which enhances the coding of the video stream by adding the size of all the pictures I, P, B of the group of pictures in an area juxtaposing each of these pictures. The extra addition of an index table, appearing at the start of the video data packet in FIG. 3, further pads the encoded video information, the whole forming a first encoded set of size M.

Figure 4:
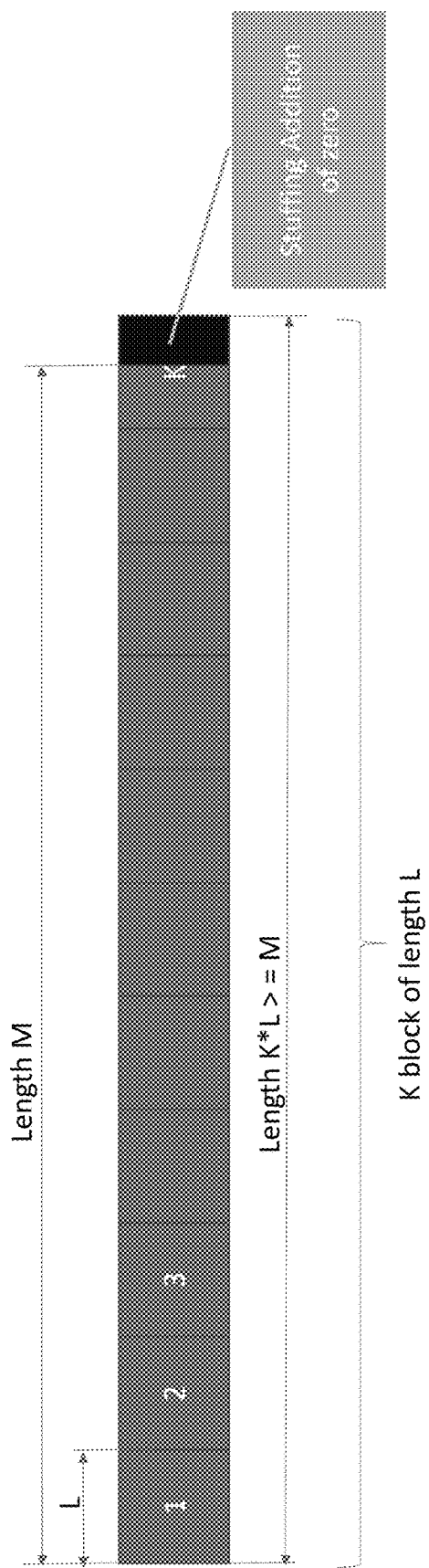
FIG. 4 represents the subdivision into K blocks of length L of the data packet M, with the possible addition of stuffing when K×L>M.

This length or size M is the starting point of a calculation targeting a subdivision into K blocks of length L (even in FIG. 4), L being a constant and K an integer number. When the result of the division of M by L is not an integer, the immediately higher integer value is then assigned to K. In most cases, K×L>M. Given this hypothesis, as represented in FIG. 4, a stuffing is applied to obtain K complete blocks of length L. This simply involves adding zeros to the block K, which are identified by the program as stuffing value.

Figure 5:
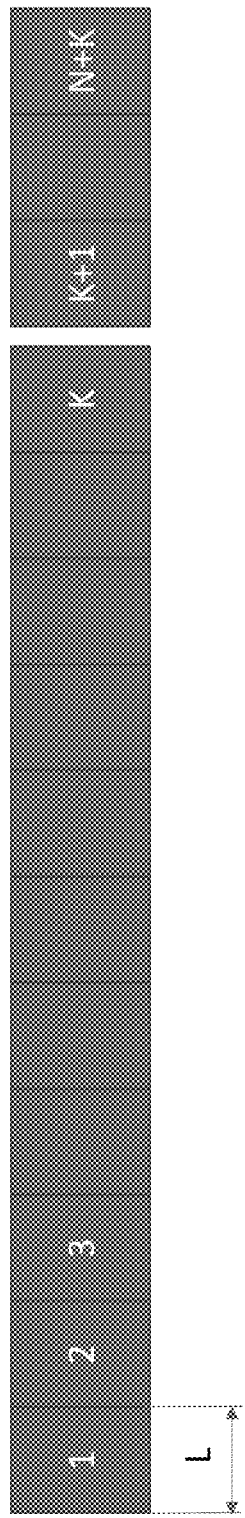
FIG. 5 illustrates the addition of N blocks due to the encoding by redundancy (FEC)
Figure 6:
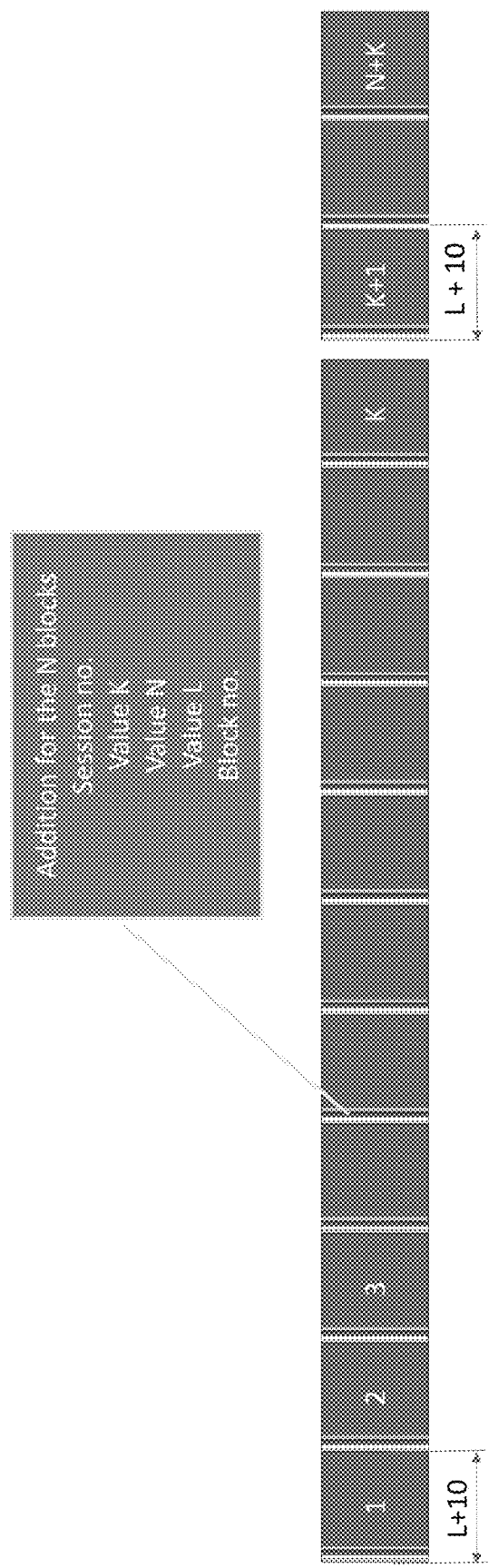
FIG. 6 finally shows the addition of additional parameters enriching the information to be transmitted and facilitating the subsequent implementation of the data recovery, if appropriate.

Hitherto, the subject has been video coding, that is to say the coding of pictures aiming for the transmission of the video stream and ultimately allowing the generation of a visible image after decoding. FIGS. 5 and 6 add the concept of correction of any transmission errors. As mentioned previously, error correction is performed in this case by redundancy, by using an algorithm that is known per se of AL-FEC (application layer forward error correction) type. The error correction encoding implements a matrix function which culminates in adding N extra data blocks, also of length L. These are the blocks K+1 to K+N appearing in these FIGS. 5 and 6.

According to a final operation specific to the invention, aiming to further optimize the processing possibilities, information is added for each of the blocks K and N, comprising in particular but not exclusively:
- the number of the group, incremented for each new group of pictures (GOP);
- the value of K, incremented from 1 to K for each block K;
- the value of N, beginning at K+1 and ending at N+K;
- the value of L; and
- the number of the block (from 1 to K+N).

This complementary information in practice better organizes the information, that is to say the set of video streams to be sent, including the redundancy blocks, so as to allow an optimization of the response of the system to video signal transmission defects. It in fact provides data on the blocks taken individually, in order to better trace the errors and locate them in the data packets.

The invention is of course not limited to the examples described and explained with reference to the figures, but it encompasses the variants and versions which fall within the scope of the claims.

The invention claimed is:

1. A method for encoding video data streams, for transmission over a wireless network governed by a local data communication protocol, the method comprising:
   receiving a video data stream having video data to be transmitted;
   subdividing the video data stream into a plurality of groups of pictures (GOP), wherein the plurality of GOP has a structure specifying an order of arrangement of images with internal coding and with predictive coding used for generating a visible image; and
   encoding said video data stream into a plurality of successive data packets, each data packet comprising a first set of data containing the video data to be transmitted, and a second set of data containing redundancy data obtained by an error correction algorithm, wherein the first set of data is composed from all data of at least one group of pictures (GOP), wherein each data packet is organized as first set of data blocks of a predetermined size and a second set of redundancy blocks of the same predetermined size, wherein an amount of the first set of data blocks is equal to a size of the first set of data divided by the predetermined size, the next integer value immediately higher than the result of the division being assigned to the amount if the result is not an integer number.

2. The method for encoding video data streams of claim 1, wherein the method further comprises:
adding a size of each picture in the group of pictures to the first set of data, in an area juxtaposing each image.

3. The method for encoding video data streams of claim 1, wherein the method further comprises:
adding, to the first set of data, an index table containing an absolute position of each image of the group of pictures.

4. The method for encoding video data streams of claim 1, wherein the method further comprises:
filling a portion of block corresponding to a difference of the amount of the first set of data blocks multiplied by the predetermined size and the size of the first set of data, which exists if the result of the division is not an integer number, with stuffing data.

5. The method for encoding video data streams in claim 1, wherein the method further comprises:
adding, for each block of the first and second sets of blocks, information comprising:
a number of the group of pictures (GOP), incremented for each new group of pictures;
an index value for each block in the first set of data blocks;
an index value for each redundancy block in the second set of redundancy blocks;
a value of the predetermined size; and
an index number of the block.

6. The method for encoding video data streams in claim 1, wherein each group of pictures (GOP) comprises a reference picture followed by at least one of a P-picture and a B-picture.

7. A system for encoding video data streams, for transmission over a wireless network governed by a local data communication protocol, wherein the system comprises:
a memory device configured to receive a video data stream having video data to be transmitted; and
a processor configured to:
subdivide the video data stream into a plurality of groups of pictures (GOP), wherein the plurality of GOP has a structure specifying an order of arrangement of images with internal coding and with predictive coding used for generating a visible image; and
encode said video data stream into a plurality of successive data packets, each data packet comprising a first set of data containing the video data to be transmitted, and a second set of data containing redundancy data obtained by an error correction algorithm, wherein the first set of data is composed from all data of at least one group of pictures (GOP),
wherein each data packet is organized as first set of data blocks of a predetermined size and a second set of redundancy blocks of the same predetermined size, wherein an amount of the first set of data blocks is equal to a size of the first set of data divided by the predetermined size, the next integer value immediately higher than the result of the division being assigned to the amount if the result is not an integer number.

8. The system of claim 7, wherein the processor is further configured to:
add a size of each picture in the group of pictures to the first set of data, in an area juxtaposing each image.

9. The system of claim 7, wherein the processor is further configured to:
add, to the first set of data, an index table containing an absolute position of each image of the group of pictures.

10. The system of claim 7, wherein the processor is further configured to:
fill a portion of block corresponding to a difference of the amount of the first set of data blocks multiplied by the predetermined size and the size of the first set of data, which exists if the result of the division is not an integer number, with stuffing data.

11. The system of claim 7, wherein the processor is further configured to:
adding, for each block of the first and second sets of blocks, information comprising:
a number of the group of pictures (GOP), incremented for each new group of pictures;
an index value for each block in the first set of data blocks;
an index value for each redundancy block in the second set of redundancy blocks;
a value of the predetermined size; and
an index number of the block.

12. The system of claim 7, wherein each group of pictures (GOP) comprises a reference picture followed by at least one of a P-picture and a B-picture.

13. A non-transitory computer readable medium comprising computer executable instructions for encoding video data streams, for transmission over a wireless network governed by a local data communication protocol, including instructions for:
subdividing the video data stream into a plurality of groups of pictures (GOP), wherein the plurality of GOP has a structure specifying an order of arrangement of images with internal coding and with predictive coding used for generating a visible image; and
encoding said video data stream into a plurality of successive data packets, each data packet comprising a first set of data containing the video data to be transmitted, and a second set of data containing redundancy data obtained by an error correction algorithm, wherein the first set of data is composed from all data of at least one group of pictures (GOP),
wherein each data packet is organized as first set of data blocks of a predetermined size and a second set of redundancy blocks of the same predetermined size, wherein an amount of the first set of data blocks is equal to a size of the first set of data divided by the predetermined size, the next integer value immediately higher than the result of the division being assigned to the amount if the result is not an integer number.

14. The non-transitory computer readable medium of claim 13, further including instructions for:
adding a size of each picture in the group of pictures to the first set of data, in an area juxtaposing each image.

15. The non-transitory computer readable medium of claim 13, further including instructions for:

adding, to the first set of data, an index table containing an absolute position of each image of the group of pictures.

16. The non-transitory computer readable medium of claim 13, further including instructions for:
filling a portion of block corresponding to a difference of the amount of the first set of data blocks multiplied by the predetermined size and the size of the first set of data, which exists if the result of the division is not an integer number, with stuffing data.

17. The non-transitory computer readable medium of claim 13, further including instructions for:
adding, for each block of the first and second sets of blocks, information comprising:
a number of the group of pictures (GOP), incremented for each new group of pictures;
an index value for each block in the first set of data blocks;
an index value for each redundancy block in the second set of redundancy blocks;
a value of the predetermined size; and
an index number of the block.

* * * * *